(12) United States Patent
Zhang et al.

(10) Patent No.: US 9,906,288 B2
(45) Date of Patent: Feb. 27, 2018

(54) CIRCUITS AND METHODS FOR SPATIO-SPECTRAL INTERFERENCE MITIGATION

(71) Applicants: Linxiao Zhang, New York, NY (US); Harish Krishnaswamy, New York, NY (US)

(72) Inventors: Linxiao Zhang, New York, NY (US); Harish Krishnaswamy, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 15/420,023

(22) Filed: Jan. 30, 2017

(65) Prior Publication Data

US 2017/0222709 A1 Aug. 3, 2017

Related U.S. Application Data

(60) Provisional application No. 62/288,852, filed on Jan. 29, 2016, provisional application No. 62/452,280, filed on Jan. 30, 2017.

(51) Int. Cl.
*H03D 1/06* (2006.01)
*H04B 7/08* (2006.01)
*H03F 3/195* (2006.01)

(52) U.S. Cl.
CPC ........... *H04B 7/0868* (2013.01); *H03F 3/195* (2013.01); *H03F 2200/294* (2013.01); *H03F 2200/451* (2013.01)

(58) Field of Classification Search
CPC . H04B 7/0868; H03F 3/195; H03F 2200/294; H03F 2200/451
(Continued)

(56) References Cited

U.S. PATENT DOCUMENTS 4,965,602 A   10/1990  Kahrilas et al.
8,140,098 B2 *  3/2012  Gorokhov ............ H04B 7/0617
                                                              455/452.2

(Continued)

OTHER PUBLICATIONS

Alamouti, S.M., "A Simple Transmit Diversity Technique for Wireless Communications", In IEEE Journal on Selected Areas Communications, vol. 16, No. 8, Oct. 1988, pp. 1451-1458.

(Continued)

*Primary Examiner* — Helene Tayong
(74) *Attorney, Agent, or Firm* — Byrne Poh LLP

(57) ABSTRACT

A plurality of receivers each having: an RF amplifier having an RFAMP input coupled to an antenna and having an RFAMP output; a capacitor having a CAP first side connected to the RFAMP output and a CAP second side; a passive mixer coupled to the RFAMP input, the CAP second side, and the output of a local oscillator phase shifter; an operational transconductor amplifier having an OTA input connected to the CAP second side and having an OTA output; a feedback resistor connected between the OTA input and the OTA output; a baseband transconductor having a BBGM input connected to the OTA input and a BBGM output; a cancelling transconductor having a CANCELLER output connected to the BBGM output and having a CANCELLER input; and an attenuator between the OTA output and the CANCELLER input, wherein the OTA output of each of the plurality of receivers are connected together.

1 Claim, 6 Drawing Sheets

(58) Field of Classification Search
USPC .......................................................... 375/346
See application file for complete search history.

(56) References Cited

U.S. PATENT DOCUMENTS

| | | | |
|---|---|---|---|
| 8,767,862 | B2 | 7/2014 | Abreu et al. |
| 2008/0167063 | A1* | 7/2008 | Nandagopalan ....... H04B 1/719 455/522 |
| 2013/0039445 | A1 | 2/2013 | Hwang |

OTHER PUBLICATIONS

Allen, J., "A Theoretical Limitation on the Formation of Lossless Multiple Beams in Linear Arrays", In IRE Transactions on Antennas and Propagation, vol. 3, No. 4, Aug. 1961, pp. 350-352.

Andrews, C. et al. "A Passive Mixer-First Receiver with Digitally Controlled and Widely Tunable RF Interface", In IEEE Journal of Solid State Circuits, vol. 45, No. 12, Dec. 2010, pp. 2696-2708.

Andrews, J. et al., "What will 5G be?", In IEEE Journal on Selected Areas in Communications, vol. 32, No. 6, Jun. 2014, pp. 1065-1082.

Babakhani, A. et al., "A 77-GHz Phased-Array Transceiver with On-Chip Antennas in Silicon: Receiver and Antennas", In IEEE Journal of Solid-State Circuits, vol. 41, No. 12, Dec. 2006, pp. 2795-2806.

Bharadia, D. et al., "Full Duplex MIMO Radios", In Proceedings of 11th USENIX Conference Networked Systems Design Implementation, Seattle, WA, US, Apr. 2-4, 2014, pp. 359-372.

Blass, J., "Multidirectional Antenna—A New Approach to Stacked Beams", In IRE International Convention Record, New York, NY, US, Mar. 21-25, 1966, pp. 48-50.

Busignies, H. et al., "Some Relations Between Speed of Indication, Bandwidth, Signal-to-Random-Noise Ratio in Radio Navigation and Direction Finding", In Proceedings of the IRE, vol. 37, No. 5, May 1949, pp. 478-488.

Cetinoneri, B. et al., "An 8×8 Butler Matrix in 0.13 μm CMOS for 5-6GHz Multibeam Applications", In IEEE Transactions on Microwave Theory and Techniques, vol. 59, No. 2, Feb. 2011, pp. 295-301.

Chang, C.-C. et al., "Novel Design of a 2.5GHz Fully Integrated CMOS Butler Matrix for Smart-Antenna Systems", In IEEE Transactions on Microwave Theory and Techniques, vol. 56, No. 8, Aug. 2008, 1757-1763.

Chu, T.S. et al., "A CMOS UWB Camera with 7×7 Simultaneous Active Pixels", In IEEE International Solid-State Circuits Conference (ISSCC), San Francisco, CA, US, Feb. 3-7, 2008, pp. 120-600.

Chu, T.S. et al., "An Integrated Ultra-Wideband Timed Array Receiver in 0.13 μm CMOS Using a Path-Sharing True Time Delay Architecture", In IEEE Journal of Solid-State Circuits, vol. 42, No. 12, Dec. 2007, pp. 2834-2850.

Cox, H. et al., "Robust Adaptive Beamforming", In IEEE Transactions on Acoustics, Speech, and Signal Processing, vol. 35, No. 10, Oct. 1987, pp. 1365-1376.

Curtis, D. et al., "Current Capabilities of Digital Beamforming", In Proceedings of the Antenna Applications Symposium, Monticello, IL, US, Sep. 18-20, 2007, pp. 1-33.

Dinc, T. et al., "A 60GHz Same-Channel Full-Duplex CMOS Transceiver and Link Based on Reconfigurable Polarization-Based Antenna Cancellation", In Proceedings of IEEE Radio Frequency Integrated Circuits Symposium (RFIC), Phoenix, AZ, US, May 17-19, 2015, pp. 31-34.

Donnet, B. et al., "MIMO Radar Techniques and Opportunities", In Proceedings of 3rd European Radar Conference (EuRAD), Manchester, UK, Sep. 13-15, 2006, pp. 112-115.

Fishler, E. et al., "Spatial Diversity in Radars—Models and Detection Performance", In IEEE Transactions on Signal Processing, vol. 54, No. 3, Mar. 2006, pp. 823-838.

Fishler, E. et al., "MIMO Radar: An Idea Whose Time has Come", In Proceedings of IEEE Radar Conference, Philadelphia, PA, US, Apr. 26-29, 2004, pp. 71-78.

Foschini, G.J., "Layered Space-Time Architecture for Wireless Communication in a Fading Environment When Using Multi-Element Antennas", In Bell Labs Technical Journal, vol. 1, No. 2, Oct. 1996, pp. 41-59.

Franks, L. et al., "An Alternative Approach to the Realization of Network Transfer Functions: The N-path Filter", In The Bell System Technical Journal, vol. 39, No. 5, Sep. 1960, pp. 1321-1350.

Fulton, C. J. et al., "Calibration Techniques for Digital Phased Arrays", In Proceedings of IEEE Int. Conf. Microwaves, Communications, Antennas and Electronics Systems (COMCAS), Tel Aviv, IL, Nov. 9-11, 2009, pp. 1-10.

Fulton, C.J. et al., "Digital Phased Arrays: Challenges and Opportunities", In Proceedings of the IEEE, vol. 104, No. 3, Mar. 2016, pp. 485-503.

Garakoui, S.K. et al., "A 1-to-2.5GHz Phased-Array IC based on gm-RC Allpass Time-Delay Cells", In IEEE International Solid-State Circuits Conference (ISSCC), San Francisco, CA, US, Feb. 19-23, 2012, pp. 80-82.

Ghaffari, A. et al., "Simultaneous Spatial and Frequency Domain Filtering at the Antenna Inputs Achieving up to +10dBm Out-of-Band/Beam P1 dB", In IEEE International Solid-State Circuits Conference (ISSCC), San Francisco, CA, US, Feb. 2013, pp. 84-85.

Ghaffari, A. et al., "Tunable High-Q N-path Band-Pass Fillers: Modeling and Verification", In IEEE Journal of Solid-State Circuits, vol. 46, No. 5, May 2011, 998-1010.

Golcuk, F. et al., "A 90-100GHz 4×4 SiGe BiCMOS Polarimetric Transmit/Receive Phased Array with Simultaneous Receive-Beams Capabilities", In IEEE Transactions on Microwave Theory and Techniques, vol. 61, No. 8, Aug. 2013, pp. 3099-3114.

Guan, X. et al., "A Fully Integrated 24-GHz Eight-Element Phased-Array Receiver in Silicon", In IEEE Journal Solid-State Circuits, vol. 39, No. 12, Dec. 2004, pp. 2311-2320.

Hajimiri, A. et al., "Integrated Phased Array Systems in Silicon", In Proceedings of the IEEE, vol. 93, No. 9, Sep. 2005, pp. 1637-1655.

Hashemi, H. et al., "Integrated True-Time-Delay-Based Ultra-Wideband Array Processing", In IEEE Communications Magazine, vol. 46, No. 9, Sep. 12, 2008, pp. 162-172.

He, M., "A 40 nm Dual-Band 3-Stream 802.11a/b/g/n/ac MIMO WLAN SoC with 1.1 Gb/s Over-the-Air Throughput", In IEEE International Solid-State Circuits Conference (ISSCC) Dig. Tech. Papers, Feb. 2014, pp. 350-351.

Inac, O. et al., "A Phased Array RFIC with Built-in Self-Test Capabilities", In IEEE Transactions on Microwave Theory and Techniques, vol. 60, No. 1, Jan. 2012, pp. 139-148.

Jain, S. et al., "A 10 GHz CMOS RX Front End with Spatial Cancellation of Co-Channel Interferers for MIMO/Digital Beamforming Arrays", In Proceedings of IEEE Radio Frequency Integrated Circuits Symposium (RFIC), May 22-24, 2016, pp. 99-102.

Kalia, S. et al., "Multi-Beam Spatio-Spectral Beamforming Receiver for Wideband Phased Arrays", In IEEE Transactions on Circuits and Systems I: Regular Papers, vol. 60, No. 8, Aug. 2013, pp. 2018-2029.

Kim, C.-Y. et al., "A 44-46GHz 16-Element SiGi BiCMOS High-Linearity Transmit/Receive Phased Array", In IEEE Transactions on Microwave Theory and Techniques, vol. 60, No. 3, Mar. 2012, pp. 730-742.

Klemmer, N. et al., "A 45 nm CMOS RF-to-Bits LTE/WCDMA FDD/TDD 2×2 MIMO Base-Station Transceiver SoC with 200 MHz RF Bandwidth", In Proceedings of IEEE International Solid-State Circuits Conference (ISSCC), San Francisco, CA, US, Jan. 31-Feb. 4, 2016, pp. 164-165.

Koh, K.J. et al., "A Millimeter-Wave (40-45GHZ) 16-Element Phased-Array Transmitter in 0.18 μm SiGe BiCMOS Technology", In IEEE Journal of Solid-State Circuits, vol. 44, No. 5, May 2009, pp. 1498-1509.

Koh, K.J. et al., "An X- and Ku-Band 8-Element Phased-Array Receiver in 0.18-μm SiGe BiCMOS Technology", In IEEE Journal of Solid-State Circuits, vol. 43, No. 6, Jun. 2008, pp. 1360-1371.

Krishnaswamy, H. et al., "A 4-Channel 24-27 GHz UWB Phased Array Transmitter in 0.13 μm CMOS for Vehicular Radar", In Proceedings of IEEE Custom Integrated Circuits Conference, San Jose, CA, US, Sep. 16-19, 2007, pp. 753-756.

(56) References Cited

OTHER PUBLICATIONS

Krishnaswamy, H. et al., "A 4-Channel 4-Beam 24-to-26GHz Spatio-Temporal RAKE Radar Transceiver in 90 nm CMOS for Vehicular Radar Applications", In Proceedings of IEEE International Solid-State Circuits Conference (ISSCC), San Francisco, CA, US, Feb. 7-11, 2010, pp. 214-215.
Krishnaswamy, H. et al., "A Variable-Phase Ring Oscillator and PLL Architecture for Integrated Phased Array Transceivers", In IEEE Journal of Solid-State Circuits, vol. 43, No. 11, Nov. 21, 2008, pp. 2446-2463.
Ku, B.-H. et al., "A 77-81GHz 16-Element Phased-Array Receiver with +/−50° Beam Scanning for Advanced Automotive Radars", In IEEE Transactions on Microwave Theory and Techniques, vol. 62, No. 11, Nov. 2014, pp. 2823-2832.
Larsson, E.G. et al., "Massive MIMO for Next Generation Wireless Systems", In IEEE Communications Magazine, vol. 52, No. 2, Apr. 2013, pp. 186-195.
Liang, G. et al., "Development of 61-Channel Digital Beamforming (DBF) Transmitter Array for Mobile Satellite Communication", In Prog. in Electromagnetics Research, vol. 97, 2009, pp. 177-195.
Lin, Z. et al., "A 0.028 mm2 11 mW Single-Mixing Blocker-Tolerant Receiver with Double-RF N-Path Filtering, S11 Centering, +13 dBm OB-IIP3 and 1.5-to-2.9 dB NF", In Proceedings of IEEE International Solid-State Circuits Conference (ISSCC), Feb. 2015, pp. 1-3.
Murphy, D. et al., "A Blocker-Tolerant, Noise-Cancelling Receiver Suitable for Wideband Wireless Applications", In IEEE Journal of Solid-State Circuits, vol. 47, No. 12, Dec. 2012, pp. 2943-2963.
Murphy, D. et al., "A Blocker-Tolerant Wideband Noise-Cancelling Receiver with a 2dB Noise Figure", In IEEE International Solid-State Circuits Conference (ISSCC), San Francisco, CA, US, Feb. 19-23, 2012, pp. 74-76.
Natarajan, A. et al., "A 77GHz Phased-Array Tranceiver with On-Chip Antennas in Silicon: Transmitter and Local LO-Path Phase Shifting", In IEEE Journal of Solid-State Circuits, vol. 41, No. 12, Dec. 2006, pp. 2807-2819.
Natarajan, A. et al., "A Fully Integrated 16-Element Phased-Array Receiver in SiGe BiCMOS fo 60GHz Communications", In IEEE Journal of Solid-State Circuits, vol. 46, No. 5, May 2011, pp. 1059-1075.
Natarajan, A. et al., "A Fully Integrated 24-GHz Phased-Array Transmitter in CMOS", In IEEE Journal of Solid-State Circuits, vol. 40, No. 12, Dec. 2005, pp. 2502-2514.
Palaskas, Y. et al., "A 5-GHz 108-Mb/s 2×2 MIMO Transceiver RFIC with Fully Integrated 20.5-dBm P1dB Power Amplifiers in 90-nm CMOS", In IEEE Journal of Solid-State Circuits, vol. 41, No. 12, Dec. 2006, pp. 2746-2756.
Park, J.W. et al., "A 20 mW GSM/WCDMA Receiver with RF Channel Selection", In IEEE International Solid-State Circuits Conference (ISSCC), San Francisco, CA, US. Feb. 9-13, 2014, pp. 356-357.
Patnaik, S. et al., "An 8GHz Multi-beam Spatio-spectral Beamforming Receiver Using an All-Passive Discrete Time Analog Baseband in 65nm CMOS", In Proceedings of IEEE Custom Integrated Circuits Conference (CICC), San Jose, CA, US, Sep. 9-12, 2012, pp. 1-4.
Pei, Y. et al., "A 30/35 GHz Dual-Band Transmitter for Phased Arrays in Communication/Radar Applications" In IEEE Journal of Solid-State Circuits, vol. 50, No. 7, Jul. 2015, pp. 1629-1644.
Puglielli, A. et al., "Design of Energy- and Cost-Efficient Massive MIMO Arrays", In Proceedings of the IEEE, vol. 104, No. 3, Mar. 2016, pp. 586-606.
Reiskarimian, N. et al., "Design of All-Passive High-Order CMOS N-path Filters", In Proceedings of IEEE Radio Frequency Integrated Circuits Symposium (RFIC), Phoenix, AZ, US, May 17-19, 2015, pp. 83-86.
Riihonen, T. et al., "Spatial Loop Interference Suppression in Full-Duplex MIMO Relays", In 2009 Conference Record of the Forty-Third Asilomar Conference on Signals, Systems, and Computers, Nov. 1-4, 2009, pp. 1-5.

Roderick, J. et al., "Silicon-based Ultra-Wideband Beam-Forming", In IEEE Journal of Solid-State Circuits, Aug. 2006, vol. 41, No. 8, pp. 1726-1739.
Shelton, J. et al., "Multiple Beams from Linear Arrays", In IRE Transactions on Antennas and Propagation, vol. 9, No. 2, Mar. 1961, pp. 154-161.
Soer, M.C.M. et al., "A 1.0-to-2.5GHz Beamforming Receiver with Constant-Gm Vector Modulator Consuming <9mW per Antenna Element in 65nm CMOS", In International Solid-State Circuits Conference Digest of Technical Papers (ISSCC), San Francisco, CA, US, Feb. 9-13, 2014, pp. 66-67.
Soer, M.C.M. et al., "A 1.0-to-4.0GHz 65nm CMOS Four-Element Beamforming Receiver Using a Switched-Capacitor Vector Modulator with Approximate Sine Weighting via Charge Redistribution", In ISSCC Digest of Technical Papers, San Francisco, CA, US, Feb. 20-24, 2011, pp. 64-66.
Soer, M.C.M. et al., "A 1.5-to-5.0 GHz Input-Matched +2dBm P1dB All-Passive Switched-Capacitor Beamforming Receiver Front-End in 65 nm CMOS", In Proceedings of International Solid-State Circuits Conference Digest of Technical Papers (ISSCC), San Francisco, CA, US, Feb. 19-23, 2012, pp. 174-176.
Tabesh, M. et al. "A 65nm CMOS 4-element sub-34 mW/Element 60GHz Phased Array Tranceiver", In IEEE Journal of Solid-State Circuits, vol. 46, No. 12, Dec. 2011, pp. 3018-3032.
Tarokh, V. et al., "Space-Time Block Coding for Wireless Communications: Performance Results", In IEEE Journal on Selected Areas in Communications, vol. 17, No. 3, Mar. 1999, pp. 451-460.
Tarokh, V. et al., "Space-Time Codes for High Data Rate Wireless Communication: Performance Criterion and Code Construction", In IEEE Transactions on Information Theory, vol. 44, No. 2, Mar. 1988, pp. 744-765.
Tellegen, B.D.H., "The Gyrator, a New Electric Network Element", In Philips Research Report, vol. 3, No. 2, Apr. 1948, pp. 81-101.
Tseng, R. et al., "A Four-Channel Beamforming Down-Converter in 90-nm CMOS Utilizing Phase Oversampling", In IEEE Journal on Solid-State Circuits, vol. 45, No. 11, Nov. 2010, pp. 2262-2272.
Valdes-Garcia, A. et al., "A Fully Integrated 16-Element Phased-Array Transmitter in SiGe BiCMOS for 60-GHz Communications", In IEEE Journal of Solid-State Circuits, vol. 45, No. 12, Dec. 2010, pp. 2757-2773.
Van Den Broek, D.-J. et al., "An In-Band Full-Duplex Radio Receiver with Passive Vector Modulator Downmixer for Self-Interference Cancellation", In IEEE Journal of Solid State Circuits, vol. 50, No. 12, Dec. 2015, pp. 3003-3014.
Wegener, A.T. et al., "Coupled Antenna Scheme Using Filter Design Techniques and Tunable Resonators to Show Simultaneous Transmit and Receive", In IEEE MTT-S International Microwave Symposium Digest (IMS), Jun. 2-7, 2013, pp. 1-4.
Wegener, A.T. et al., "Simultaneous Transmit and Receive with a Small Planar Array", In IEEE MTT-S International Microwave Symposium Digest (IMS), Jun. 17-22, 2012, pp. 1-3.
Zhang, L. et al., "Scalable Spatial Notch Suppression in Spatio-Spectral-Filtering MIMO Receiver Arrays for Digital Beamforming", In IEEE Journal of Solid-State Circuits, vol. 51, No. 12, Dec. 2016, pp. 3152-3166.
Zhang, L. et al., "A Scalable 0.1-to-1.7 GHz Spatio-Spectral-Filtering 4-Element MIMO Receiver Array with Spatial Notch Suppression Enabling Digital Beamforming", In Proceedings of IEEE International Solid-State Circuits Conference (ISSCC), San Francisco, CA, US, Jan. 31-Feb. 4, 2016, pp. 166-167.
Zheng, Y. et al., "Coherent Interference Suppression with an Adaptive Array using Spatial Affine Projection Algorithm", In Proceedings of the Vehicular Technology Conference, Boston, MA, US, Sep. 24-28, 2000, pp. 105-109.
Zhou, J. et al. "Low-Noise Active Cancellation of Transmitter Leakage and Transmitter Noise in Broadband Wireless Receivers fro FDD/Co-existence", In IEEE Journal of Solid-State Circuits, vol. 49, No. 12, Dec. 2014, pp. 3046-3062.
Zhou, J. et al., "Integrated Wideband Self-Interference Cancellation in the RF Domain for FDD and Full-Duplex Wireless", In IEEE

(56) References Cited

OTHER PUBLICATIONS

Journal of Solid-State Circuits, vol. 50, No. 12, Dec. 2015, pp. 3015-3031.

* cited by examiner

CIRCUITS AND METHODS FOR SPATIO-SPECTRAL INTERFERENCE MITIGATION

CROSS REFERENCE TO RELATED APPLICATION

This application claims the benefit of U.S. Provisional Patent Applications Nos. 62/288,852, filed Jan. 29, 2016, and 62/452,280, filed Jan. 30, 2017, each of which is hereby incorporated by reference herein in its entirety.

STATEMENT REGARDING GOVERNMENT FUNDED RESEARCH

This invention was made with government support under FA8650-14-1-7414 awarded by DARPA. The government has certain rights in the invention.

BACKGROUND

Multiple-antenna techniques, often referred to as multiple-input-multiple-output (MIMO) techniques, enable communication with increased spectral efficiency, either through linear beamforming which enhances signal-to-noise ratio (SNR), spatial multiplexing which enhances data rate through multiple parallel streams, or spatial diversity which enhances link reliability.

MIMO systems that leverage multiplexing or diversity gains typically require space-time array signal processing that can practically only be implemented in the digital domain, and thus require digitization in each antenna signal path. A digital array also enables powerful digital array calibration. However, since the spatial processing is only performed in the digital domain, RF/analog spatial filtering is forsaken, leaving the RF/analog circuits and the data converters exposed to all the spatial content that is present at the antenna aperture, desired or not. In the presence of strong interference signals, such an architecture requires high instantaneous dynamic range from the RF/analog circuits and the data converters, leading to high power consumption and cost.

Accordingly, new circuits and methods for spatio-spectral interference mitigation are desirable.

SUMMARY

Circuits and methods for spatio-spectral interference mitigation are provided.

In some embodiments, circuits for mitigating spatio-spectral interference in a multi-input, multi-output receiver are provided, the circuits comprising: a plurality of receivers, each comprising: a local oscillator generator having a plurality of phase outputs, including a first phase output and a second phase output; an antenna having an output; an RF amplifier having an input coupled to the output of the antenna and having an output; a first switch having a control input coupled to the first phase output, having a first side connected to the input of the RF amplifier, and having a second side; a first capacitor having a first side connected to the second side of the first switch and having a second side connected to the output of the RF amplifier; a second switch having a control input coupled to the second phase output, having a first side connected to the input of the RF amplifier, and having a second side; a second capacitor having a first side connected to the second side of the second switch and having a second side connected to the output of the RF amplifier; a first operational transconductance amplifier having an input connected to the second side of the first switch and having an output; a first feedback resistor having a first side connected to the input of the first operational transconductance amplifier and having a second side connected to the output of the first operational transconductance amplifier; a second operational transconductance amplifier having an input connected to the second side of the second switch and having an output; a second feedback resistor having a first side connected to the input of the second operational transconductance amplifier and having a second side connected to the output of the second operational transconductance amplifier; a first transconductor having an input connected to the input of the first operational transconductance amplifier and having an output; a second transconductor having an input connected to the input of the second operational transconductance amplifier and having an output; a first attenuator having an input connected to the output of the first operational transconductance amplifier and having an output; a third transconductor having an input connected to the output of the first attenuator and having an output coupled to the output of the first transconductor; a second attenuator having an input connected to the output of the second operational transconductance amplifier and having an output; and a fourth transconductor having an input connected to the output of the second attenuator and having an output coupled to the output of the second transconductor, wherein the outputs of the first operational transconductance amplifier in each of the plurality of receivers are connected together, and wherein the outputs of the second operational transconductance amplifier in each of the plurality of receivers are connected together.

DETAILED DESCRIPTION

Circuits and methods for spatio-spectral interference mitigation are provided.

Figure 1:
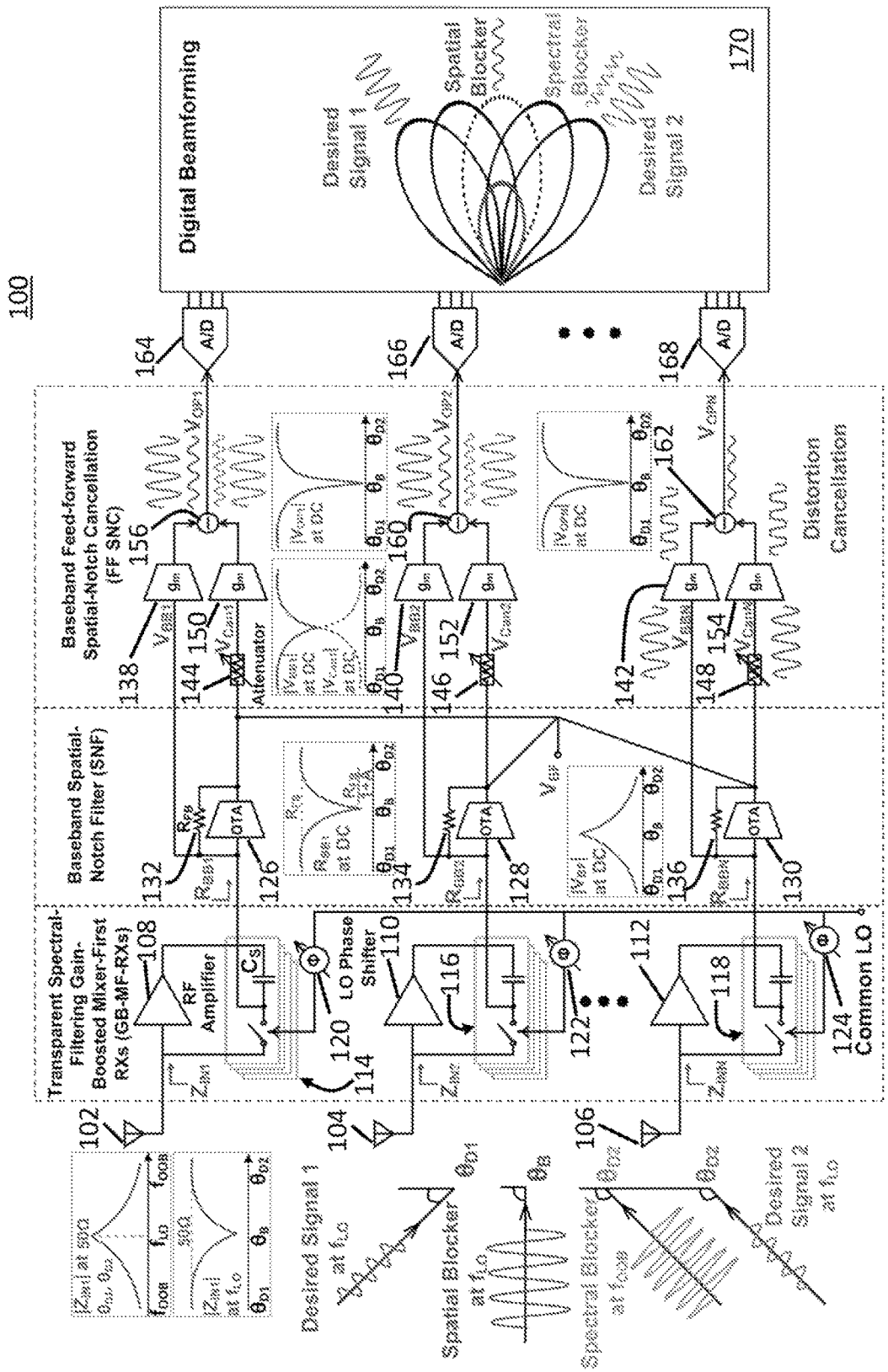
FIG. 1 is an example of a schematic of a circuit for canceling spatial and spectral blockers in accordance with some embodiments.

Turning to FIG. 1, an example 100 of a circuit for reducing the impact of spatial blockers and spectral blockers on desired signals in a MIMO receiver in accordance with some embodiments is illustrated.

As shown, circuit 100 includes N antennas 102, 104, and 106, N RF amplifiers 108, 110, and 112, N passive mixers and capacitors 114, 116, and 118, N phase shifters 120, 122, and 124, N operational transconductance amplifiers (OTAs)

126, 128, and 130, N feedback resistors $R_{FB}$ 132, 134, and 136, N baseband transconductors 138, 140, and 142, N attenuators 144, 146, and 148, N cancellation transconductors 150, 152, and 154, N analog-to-digital converters (ADCs) 164, 166, and 168, and a digital beamforming mechanism 170.

Each path from left to right in FIG. 1 from an antenna to an ADC forms an element of circuit 100. As shown, the signals at the outputs of OTAs 126, 128, and 130 are connected together at node $V_{BF}$.

N antennas 102, 104, and 106 can be implemented and arranged in any suitable manner, and any suitable number of antennas can be implemented, in some embodiments. For example, in some embodiments, the N antennas can be arranged in a uniform linear array with a λ/2 antenna spacing, where λ is wavelength in free space at the local oscillator (LO) frequency input to the mixer.

N RF amplifiers 108, 110, and 112 can be implemented in any suitable manner, and any suitable number of RF amplifiers can be implemented, in some embodiments. For example, in some embodiments, each RF amplifier can be implemented using a low noise amplifier (LNA).

N passive mixers and capacitors 114, 116, and 118 can be implemented in any suitable manner, and any suitable number of passive mixers and capacitors can be implemented, in some embodiments. For example, in some embodiments, the passive mixers can be implemented using switching transistors and capacitors can be implemented using a Metal-Insulator-Metal structure with a capacitance of 10 pF.

N phase shifters 120, 122, and 124 can be implemented in any suitable manner, and any suitable number of phase shifters can be implemented, in some embodiments. For example, in some embodiments, the phase shifters can be Cartesian phase shifters that are used in each LO path for notch steering. More particular examples of the phase shifters that can be used in some embodiments are shown in, and described in connection with, FIG. 4.

N operational transconductance amplifiers (OTAs) 126, 128, and 130 can be implemented in any suitable manner, and any suitable number of OTAs can be implemented, in some embodiments.

N feedback resistors $R_{FB}$ 132, 134, and 136 can be implemented in any suitable manner, and any suitable number of feedback resistors can be implemented, in some embodiments. For example, in some embodiments, feedback resistors can be 3.5 k ohm.

Together, the pairs of OTAs 126, 128, and 130 and feedback resistors $R_{FB}$ 132, 134, and 136, respectively, in each receiver path or element form a gyrator.

N baseband transconductors $g_m$ 138, 140, and 142 can be implemented in any suitable manner, and any suitable number of transconductors can be implemented, in some embodiments.

N attenuators 144, 146, and 148 can be implemented in any suitable manner, and any suitable number of attenuators can be implemented, in some embodiments. For example, in some embodiments the attenuators can be 7-bit digital attenuators that are controlled digitally by off-chip control signals from a hardware processor (not shown).

N cancellation transconductors $g_m$ 150, 152, and 154 can be implemented in any suitable manner, and any suitable number of transconductors can be implemented, in some embodiments. For example, in some embodiments, these cancellation transconductors can be identical to the baseband transconductors.

N analog-to-digital converters (ADCs) 164, 166, and 168 can be implemented in any suitable manner, and any suitable number of ADCs can be implemented, in some embodiments.

Digital beamforming mechanism 170 can be implemented in any suitable manner, and any suitable number of digital beamforming mechanisms can be implemented, in some embodiments.

During operation, when signals are equal in magnitude and in phase as they arrive from the broadside direction (θ=0°, or perpendicular to a line of MIMO antennas), the impedance seen at each signal input ($R_{BB1,2...N}$ in FIG. 1) is low due to the high gain of OTAs 126, 128, and 130. When signals arrive at end-fire incidence (θ=+−/90°, or parallel to a line of MIMO antennas), the impedance seen at each signal input ($R_{BB1,2...N}$ in FIG. 1) is equal to the resistor $R_{FB}$ due to the AC ground at $V_{BF}$.

This impedance profile can be translated to RF at the antenna so that incidence-angle-dependent input reflection coefficients are provided that are reflective at broadside incidence angles, and matched to 50Ω at off-broadside incidence angles. Thus, voltages from signals incident from broadside are suppressed at the inputs of antennas 102, 104, and 106, outputs of RF amplifiers 108, 110, and 112, and at the inputs of baseband transconductors $g_m$ 138, 140, and 142.

In some embodiments, the notch formed at broadside incidence angles can be steered in any direction by phase-shifting the LO signals of mixers 114, 116, and 118 relative to each other using phase shifters 120, 122, and 124.

In addition, in some embodiments, tunable spectral filtering can be provided by tuning the LO signal frequency in any suitable manner, such as using a separate hardware processor.

In some embodiments, the attenuators and the cancellation transconductors can be used to perform feedforward cancellation of residual interference and distortion. In order to do so, a beam formed in the notch direction at node $V_{BF}$ is used as a replica of blockers in that direction. Next, the variable attenuators scale the replica to match the residue. The attenuators can be controlled in any suitable manner, such as using a separate hardware processor. Then, cancellation transconductors generate a residue current. Finally, the residue current is subtracted from the current generated by the baseband transconductors at nodes 156, 160, and 162 to thereby cancel the residual interference and distortion.

Figure 2:
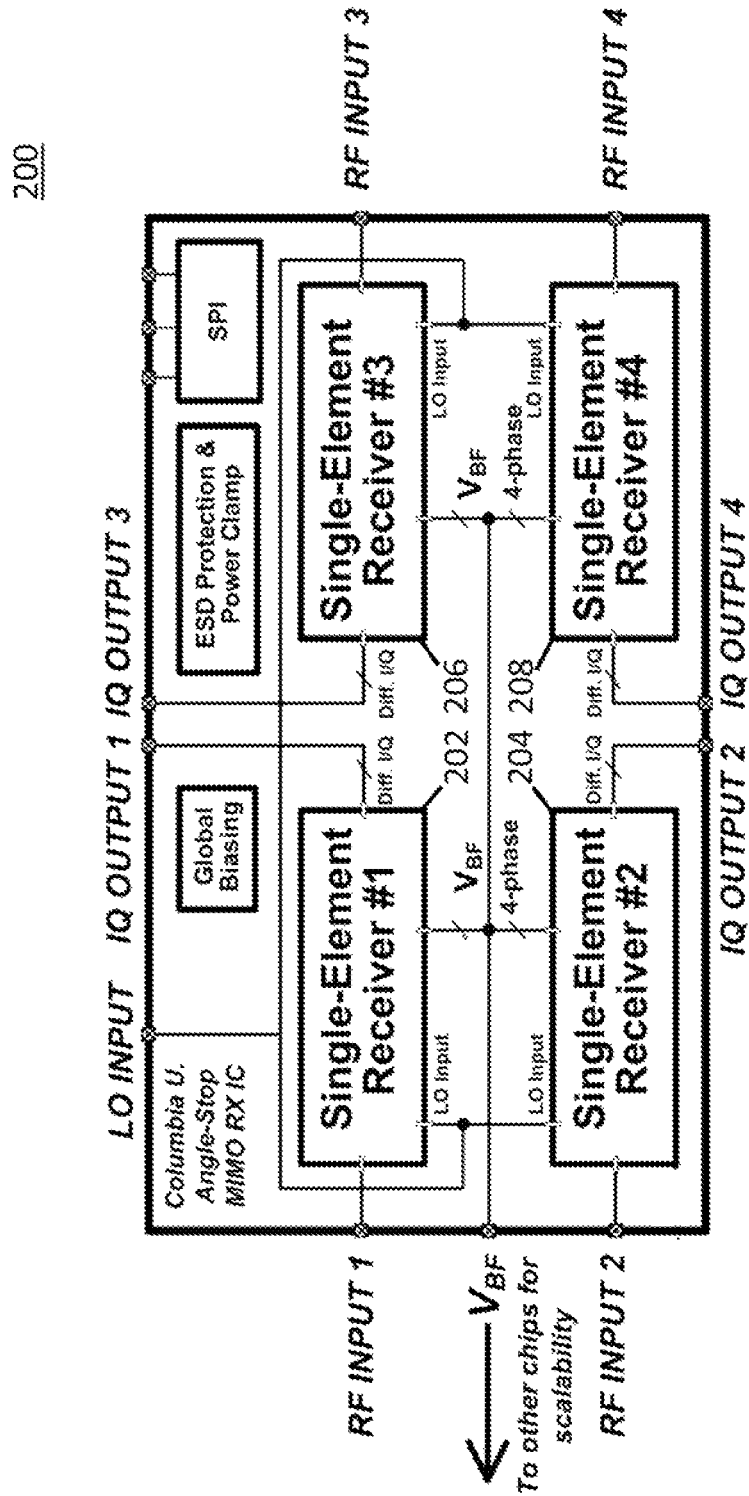
FIG. 2 is an example of a schematic of an integrated circuit having four single-element receivers for canceling spatial and spectral blockers in accordance with some embodiments.

Turning to FIG. 2, an example 200 of an integrated circuit (IC) having four single-element receivers based on FIG. 1 in accordance with some embodiments is shown. In some embodiments, these single-element receivers can operate over 0.1 to 1.7 GHz. In some embodiments, IC 200 can be implemented in any suitable technology, such as 65 nm CMOS.

As illustrated in FIG. 2, IC 200 can include four single-element receivers 202, 204, 206, and 208. These receivers can be implemented in any suitable manner, and although only four receivers are shown in FIG. 2, any suitable number of receivers can be used. For example, in some embodiments, each of receivers 202, 204, 206, and 208 can be implemented using example a receiver like receiver 300 of FIG. 3.

As shown in FIG. 2, the signal $V_{BF}$ can be connected to $V_{BF}$ of other ICs 200 so that more that more than four single-element receivers can be connected together.

Figure 3:
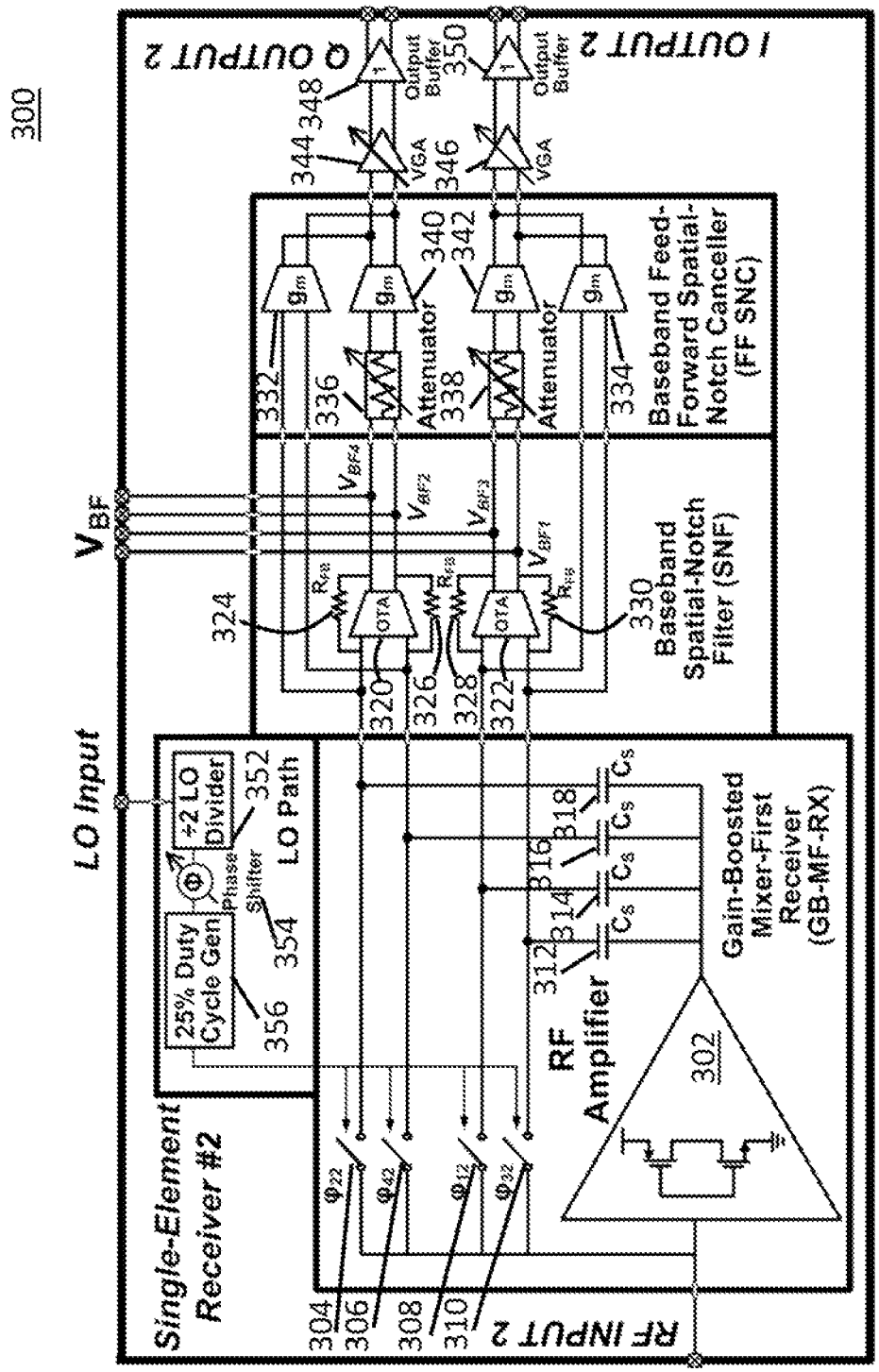
FIG. 3 is an example of a schematic of an example of a single-element receiver of the circuit of FIG. 2 in accordance with some embodiments.

As shown in FIG. 3, receiver 300 includes an RF amplifier 302, four passive mixers 304, 306, 308, and 310, four capacitors 312, 314, 316, and 318, two operational transconductance amplifiers (OTAs) 320 and 322, four feedback resistors 324, 326, 328, and 330, two baseband transconductors 332 and 334, two attenuators 336 and 338, two cancellation transconductors 340 and 342, two variable gain amplifiers 344 and 346, two buffers 348 and 350, a divide-by-two local oscillator (LO) divider 352, a phase shifter 354, and a 25% duty cycle generator 356.

RF amplifier 302 can be implemented in any suitable manner, and any suitable number of RF amplifiers can be implemented, in some embodiments. For example, in some embodiments, RF amplifier can be implemented using a low noise amplifier (LNA).

Passive mixers 304, 306, 308, and 310 can be implemented in any suitable manner, and any suitable number of passive mixers can be implemented, in some embodiments. For example, in some embodiments, the passive mixers can be implemented using switching transistors.

Capacitors 312, 314, 316, and 318 can be implemented in any suitable manner, and any suitable number of capacitors can be implemented, in some embodiments. For example, in some embodiments, capacitors can be implemented using Metal-Insulator-Metal structures with a capacitance of 10 pF.

Figure 5:
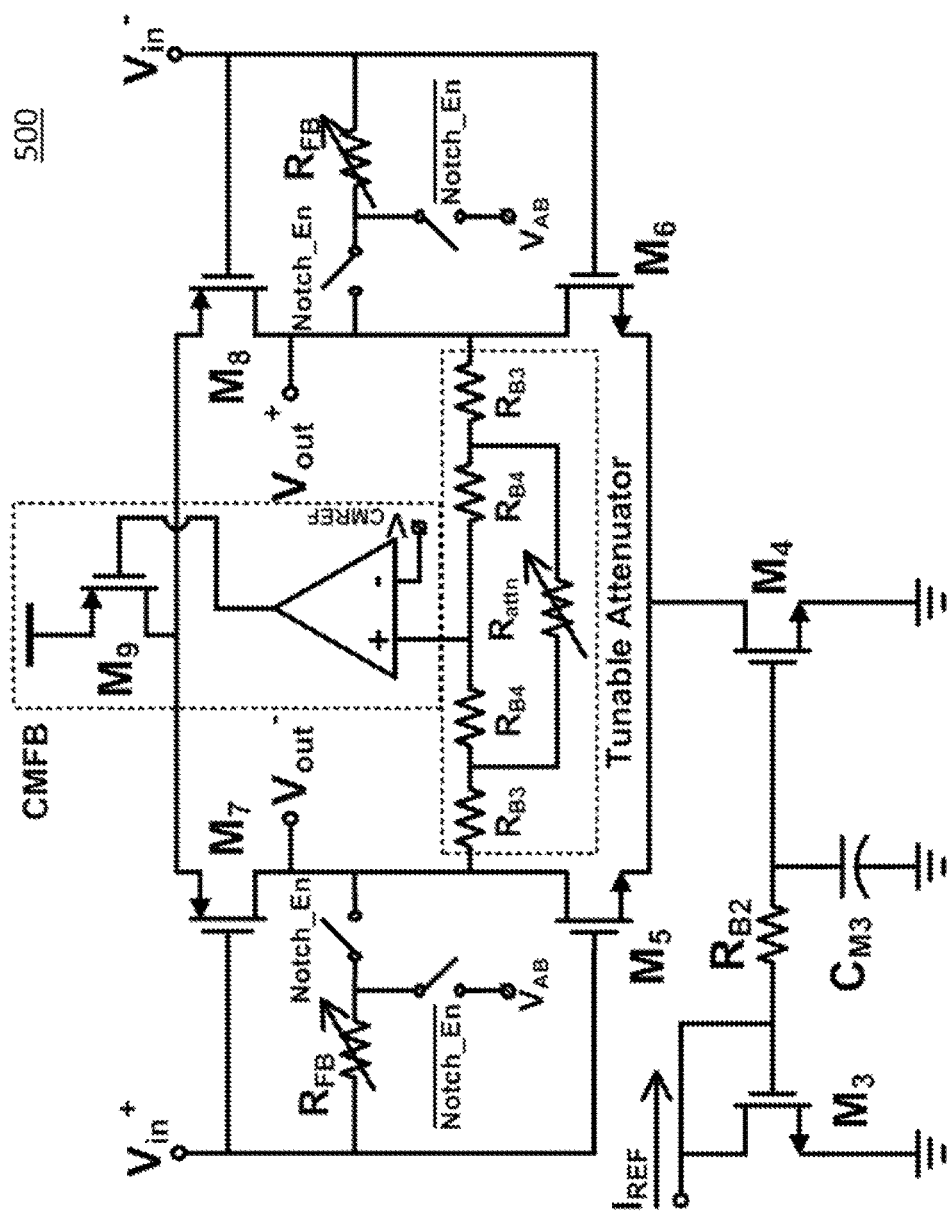
FIG. 5 is an example of a schematic of an operational transconductance amplifier that can be used in the circuit of FIG. 1 in accordance with some embodiments.

Operational transconductance amplifiers (OTAs) 320 and 322 can be implemented in any suitable manner, and any suitable number of OTAs can be implemented, in some embodiments. For example, in some embodiments, OTAs 320 and 322 can be implemented as OTA 500 as illustrated in FIG. 5.

Feedback resistors 324, 326, 328, and 330 can be implemented in any suitable manner, and any suitable number of feedback resistors can be implemented, in some embodiments. For example, in some embodiments, feedback resistors can be 3.5 k ohm.

Together, the sets of OTAs 320 and 322 and feedback resistors $R_{FB}$ 324, 326, 328, and 330 in each receiver path or element form a gyrator.

Figure 6:
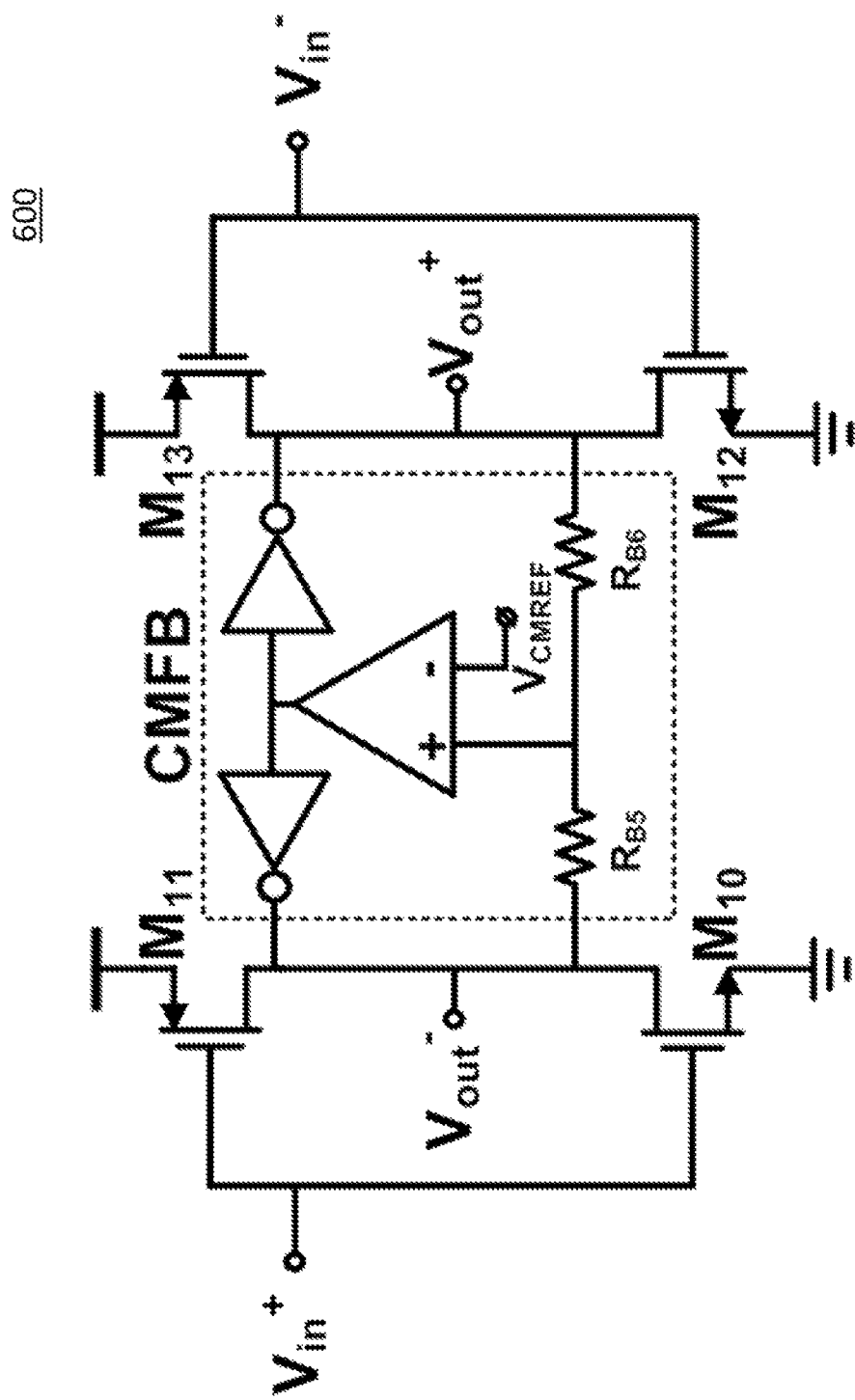
FIG. 6 is an example of a schematic of a transconductor that can be used in the circuit of FIG. 1 in accordance with some embodiments.

Baseband transconductors 332 and 334 can be implemented in any suitable manner, and any suitable number of baseband transconductors can be implemented, in some embodiments. For example, in some embodiments, transconductors 332 and 334 can be implemented as transconductor 600 as illustrated in FIG. 6.

Attenuators 336 and 338 can be implemented in any suitable manner, and any suitable number of attenuators can be implemented, in some embodiments. For example, in some embodiments, the attenuators can be 7-bit digital attenuators that are controlled digitally with control signals from a hardware processor, and can be implemented in transconductor 600 as illustrated in FIG. 6.

Cancellation transconductors 340 and 342 can be implemented in any suitable manner, and any suitable number of cancellation transconductors can be implemented, in some embodiments. For example, in some embodiments, these cancellation OTAs can be identical to the baseband transconductors.

Variable gain amplifiers (VGAs) 344 and 346 can be implemented in any suitable manner, and any suitable number of VGAs can be implemented, in some embodiments. For example, in some embodiments, the VGAs can have 30 dB range of gain control.

Buffers 348 and 350 can be implemented in any suitable manner, and any suitable number of buffers can be implemented, in some embodiments. For example, in some embodiments, the buffers can be 50 ohm buffers.

Divide-by-two local oscillator (LO) divider 352 can be implemented in any suitable manner, in some embodiments.

Phase shifter 354 can be implemented in any suitable manner, and any suitable number of phase shifters can be implemented, in some embodiments. For example, in some embodiments, the phase shifter can be implemented as described below in connection with FIG. 4.

25% duty cycle generator 356 can be implemented in any suitable manner, in some embodiments.

Figure 4:
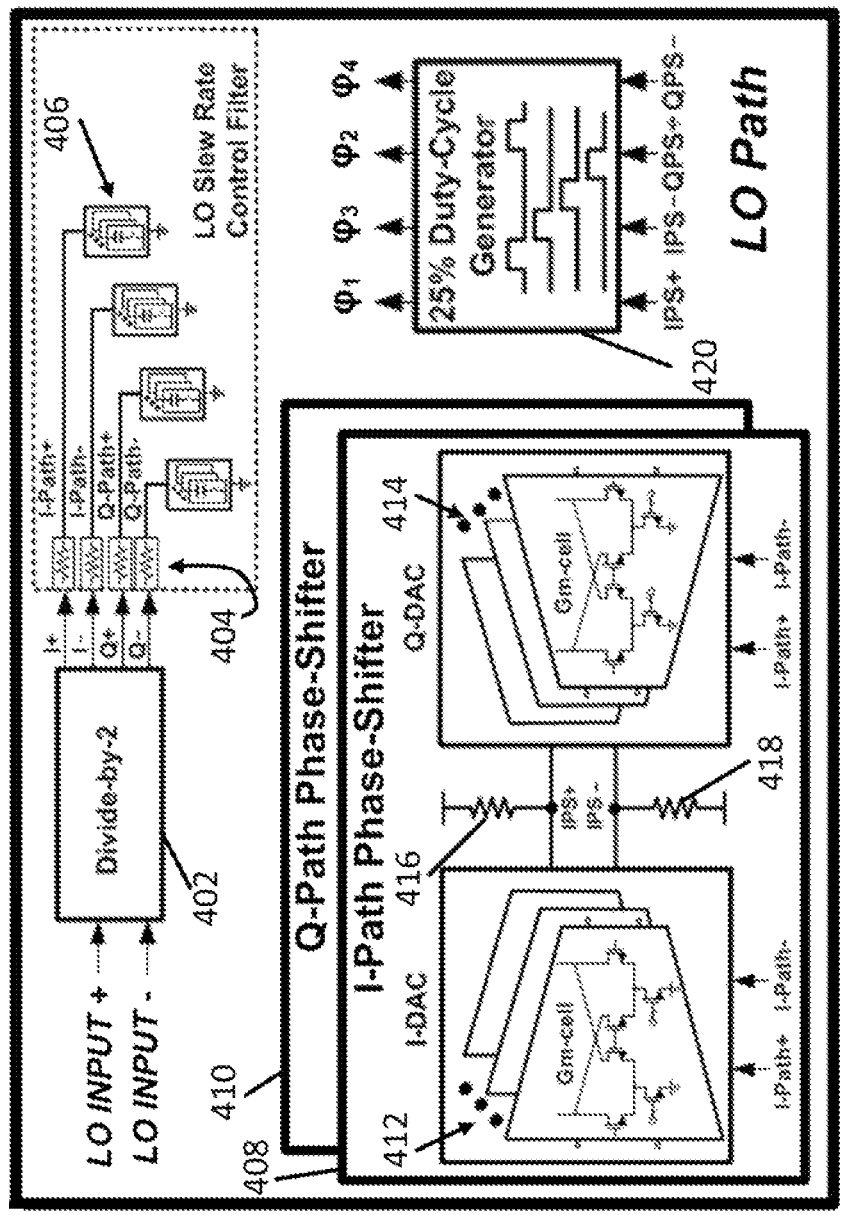
FIG. 4 is an example of a local oscillator path of a single-element receiver of the circuit of FIG. 3 in accordance with some embodiments.

Turning to FIG. 4, examples of circuits implementing divide-by-two local oscillator (LO) divider 352, phase shifter 354, and 25% duty cycle generator 356 of FIG. 3 in accordance with some embodiments are shown.

As illustrated, FIG. 4 shows a divide-by-two circuit 402 that is driven by a local oscillator (LO) signal (that is twice the desired LO signal) and that drives resistors 404 and variable capacitors 406 to produce signals I-Path+, I-Path−, Q-Path+, and Q-Path−. Together the resistors and variable capacitors provide a local oscillator slew rate control filter that partially removes harmonic component.

As also illustrated, an I-path phase shifter 408 and a Q-path phase shifter 410 can each be formed from banks of parallel, selectable transconductance cells 412 and 414 and resistors 416 and 418. The banks can have any suitable number, such as six, bits of control. In some embodiments, the cells 412 can each have the same transconductance value and the cells 414 can each of the same transconductance value. Phase shifter 408 is driven by signals I-Path+ and I-Path− and produces signals IPS+ and IPS−. Phase shifter 410 is driven by signals Q-Path+ and Q-Path− and produces signals QPS+ and QPS−.

As further illustrated, the signals IPS+, IPS−, QPS+, and QPS− are provided to a 25% duty-cycle generator 420 that generators signals $\phi_1$, $\phi_2$, $\phi_3$, $\phi_4$, which are 25% duty cycle versions of IPS+, IPS−, QPS+, and QPS−, respectively, so that signals $\phi_1$, $\phi_2$, $\phi_3$, $\phi_4$ do not overlap. Signals $\phi_1$, $\phi_2$, $\phi_3$, $\phi_4$ can then be used to control switches 304, 306, 308, and 310 (FIG. 3) of the passive mixers.

Although the invention has been described and illustrated in the foregoing illustrative embodiments, it is understood that the present disclosure has been made only by way of example, and that numerous changes in the details of embodiment of the invention can be made without departing from the spirit and scope of the invention, which is limited only by the claims that follow. Features of the disclosed embodiments can be combined and rearranged in various ways.

What is claimed is:

1. A circuit for mitigating spatio-spectral interference in a multi-input, multi-output receiver, comprising:
   a plurality of receivers, each comprising:
      a local oscillator generator having a plurality of phase outputs, including a first phase output and a second phase output;
      an antenna having an output;
      an RF amplifier having an input coupled to the output of the antenna and having an output;
      a first switch having a control input coupled to the first phase output, having a first side connected to the input of the RF amplifier, and having a second side;
      a first capacitor having a first side connected to the second side of the first switch and having a second side connected to the output of the RF amplifier;
      a second switch having a control input coupled to the second phase output, having a first side connected to the input of the RF amplifier, and having a second side;

a second capacitor having a first side connected to the second side of the second switch and having a second side connected to the output of the RF amplifier;

a first operational transconductance amplifier having an input connected to the second side of the first switch and having an output;

a first feedback resistor having a first side connected to the input of the first operational transconductance amplifier and having a second side connected to the output of the first operational transconductance amplifier;

a second operational transconductance amplifier having an input connected to the second side of the second switch and having an output;

a second feedback resistor having a first side connected to the input of the second operational transconductance amplifier and having a second side connected to the output of the second operational transconductance amplifier;

a first transconductor having an input connected to the input of the first operational transconductance amplifier and having an output;

a second transconductor having an input connected to the input of the second operational transconductance amplifier and having an output;

a first attenuator having an input connected to the output of the first operational transconductance amplifier and having an output;

a third transconductor having an input connected to the output of the first attenuator and having an output coupled to the output of the first transconductor;

a second attenuator having an input connected to the output of the second operational transconductance amplifier and having an output; and a fourth transconductor having an input connected to the output of the second attenuator and having an output coupled to the output of the second transconductor, wherein the outputs of the first operational transconductance amplifier in each of the plurality of receivers are connected together, and wherein the outputs of the second operational transconductance amplifier in each of the plurality of receivers are connected together.

* * * * *